United States Patent
Kawano

(10) Patent No.: US 10,900,618 B2
(45) Date of Patent: Jan. 26, 2021

(54) LIGHT-EMITTING DEVICE HOLDER AND LIGHT SOURCE DEVICE

(71) Applicant: NICHIA CORPORATION, Anan (JP)

(72) Inventor: Yusuke Kawano, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/746,754

(22) Filed: Jan. 17, 2020

(65) Prior Publication Data
US 2020/0232606 A1 Jul. 23, 2020

(30) Foreign Application Priority Data

Jan. 22, 2019 (JP) .................................. 2019-008415
Oct. 8, 2019 (JP) .................................. 2019-184979

(51) Int. Cl.
*F21K 9/237* (2016.01)
*F21V 29/76* (2015.01)
*F21Y 115/10* (2016.01)

(52) U.S. Cl.
CPC ............ *F21K 9/237* (2016.08); *F21V 29/763* (2015.01); *F21Y 2115/10* (2016.08)

(58) Field of Classification Search
CPC ..... F21K 9/237; F21V 29/763; F21Y 2115/10
See application file for complete search history.

(56) References Cited

U.S. PATENT DOCUMENTS

| 2006/0141851 A1* | 6/2006 | Matsui ..................... F21V 29/73 439/490 |
| 2006/0181878 A1* | 8/2006 | Burkholder ............. F21S 43/14 362/294 |
| 2007/0097692 A1* | 5/2007 | Suehiro .................... F21V 29/83 362/294 |
| 2007/0211205 A1* | 9/2007 | Shibata ................. F21V 29/763 349/161 |
| 2008/0217643 A1* | 9/2008 | Lin ....................... F21V 29/763 257/99 |
| 2009/0140285 A1 | 6/2009 | Lin et al. |

(Continued)

FOREIGN PATENT DOCUMENTS

| JP | 2006310138 A | 11/2006 |
| JP | 2009-038299 A | 2/2009 |

(Continued)

*Primary Examiner* — Donald L Raleigh
(74) *Attorney, Agent, or Firm* — Global IP Counselors, LLP

(57) ABSTRACT

A light-emitting device holder is configured to fix a light-emitting device to a mounting object. The light-emitting device includes a substrate, a light-emitting element, and a pad. The light-emitting device holder includes a holder main body, a terminal and an insulating member. The holder main body defines an opening at a position corresponding to the light-emitting element in a fixed state after the light-emitting device is fixed to the mounting object by the light-emitting device holder. The terminal is attached to the holder main body, and configured to be in contact with the pad in the fixed state. The insulating member is attached to the holder main body, and configured to be in contact with at least a region of the surface of the substrate between the pad and a portion of an edge of the substrate that is closest to the pad in the fixed state.

13 Claims, 5 Drawing Sheets

(56) References Cited

U.S. PATENT DOCUMENTS

| | | | |
|---|---|---|---|
| 2010/0072505 A1* | 3/2010 | Gingrich, III | F21V 17/005 |
| | | | 257/99 |
| 2010/0188848 A1* | 7/2010 | Liaw | F21V 29/763 |
| | | | 362/249.02 |
| 2011/0170314 A1* | 7/2011 | Hsu | G02F 1/133603 |
| | | | 362/612 |
| 2012/0020086 A1 | 1/2012 | Kataoka | |
| 2012/0106155 A1 | 5/2012 | Hata et al. | |
| 2014/0321126 A1* | 10/2014 | Narag | F21K 9/00 |
| | | | 362/306 |
| 2015/0308632 A1* | 10/2015 | Ueno | F21K 9/60 |
| | | | 362/235 |
| 2016/0025319 A1 | 1/2016 | Meyer | |
| 2017/0102115 A1 | 4/2017 | Takeda et al. | |

FOREIGN PATENT DOCUMENTS

| | | |
|---|---|---|
| JP | 2009-135440 A | 6/2009 |
| JP | 2012-003999 A | 1/2012 |
| JP | 2012-094401 A | 5/2012 |
| JP | 20140-93287 A | 5/2014 |
| JP | 2014-120544 A | 6/2014 |
| JP | 2014-154468 A | 8/2014 |
| JP | 2017-084569 A | 5/2017 |
| JP | 6354967 B2 | 7/2018 |

\* cited by examiner

LIGHT-EMITTING DEVICE HOLDER AND LIGHT SOURCE DEVICE

CROSS-REFERENCE TO RELATED APPLICATIONS

This application is based upon and claims the benefit of priority from the prior Japanese Patent Application No. 2019-008415, filed on Jan. 22, 2019, and Japanese Patent Application No. 2019-184979, filed on Oct. 8, 2019; the entire contents of which are incorporated herein by reference.

FIELD

Embodiments relate to a light-emitting device holder and a light source device.

BACKGROUND

In recent years, a light-emitting device in which a light-emitting diode (LED) is used is widely used as a lighting device, a light source of a display device, etc., due to the advantages of low power consumption, long life, etc. A light-emitting device holder is used to fix such a light-emitting device to a mounting object such as a heat sink, etc. It is desirable to improve the insulative properties of the light-emitting device holder between the light-emitting device and the mounting object.

SUMMARY

According to a certain aspect of the present disclosure, a light-emitting device holder is configured to fix a light-emitting device to a mounting object. The light-emitting device includes a substrate, a light-emitting element mounted to a surface of the substrate, and a pad provided on the surface of the substrate and connected to the light-emitting element. The light-emitting device holder includes a holder main body, a terminal and an insulating member. The holder main body defines an opening at a position corresponding to the light-emitting element in a fixed state after the light-emitting device is fixed to the mounting object by the light-emitting device holder. The terminal is attached to the holder main body. The terminal is configured to be in contact with the pad in the fixed state. The insulating member is attached to the holder main body. The insulating member is configured to be in contact with at least a region of the surface of the substrate between the pad and a portion of an edge of the substrate that is closest to the pad in the fixed state.

According to another aspect of the present disclosure, a light source device includes: the light-emitting device holder; and a light-emitting device mounted to the mounting object by the light-emitting device holder.

DETAILED DESCRIPTION

Embodiments of the invention will now be described with reference to the drawings. The drawings referred to below are schematic; and some components may not be illustrated for the sake of brevity or may be enhanced or exaggerated as appropriate. The dimensional ratios of the components may not always match between the drawings.

First Embodiment

First, a first embodiment will be described.

Figure 1:
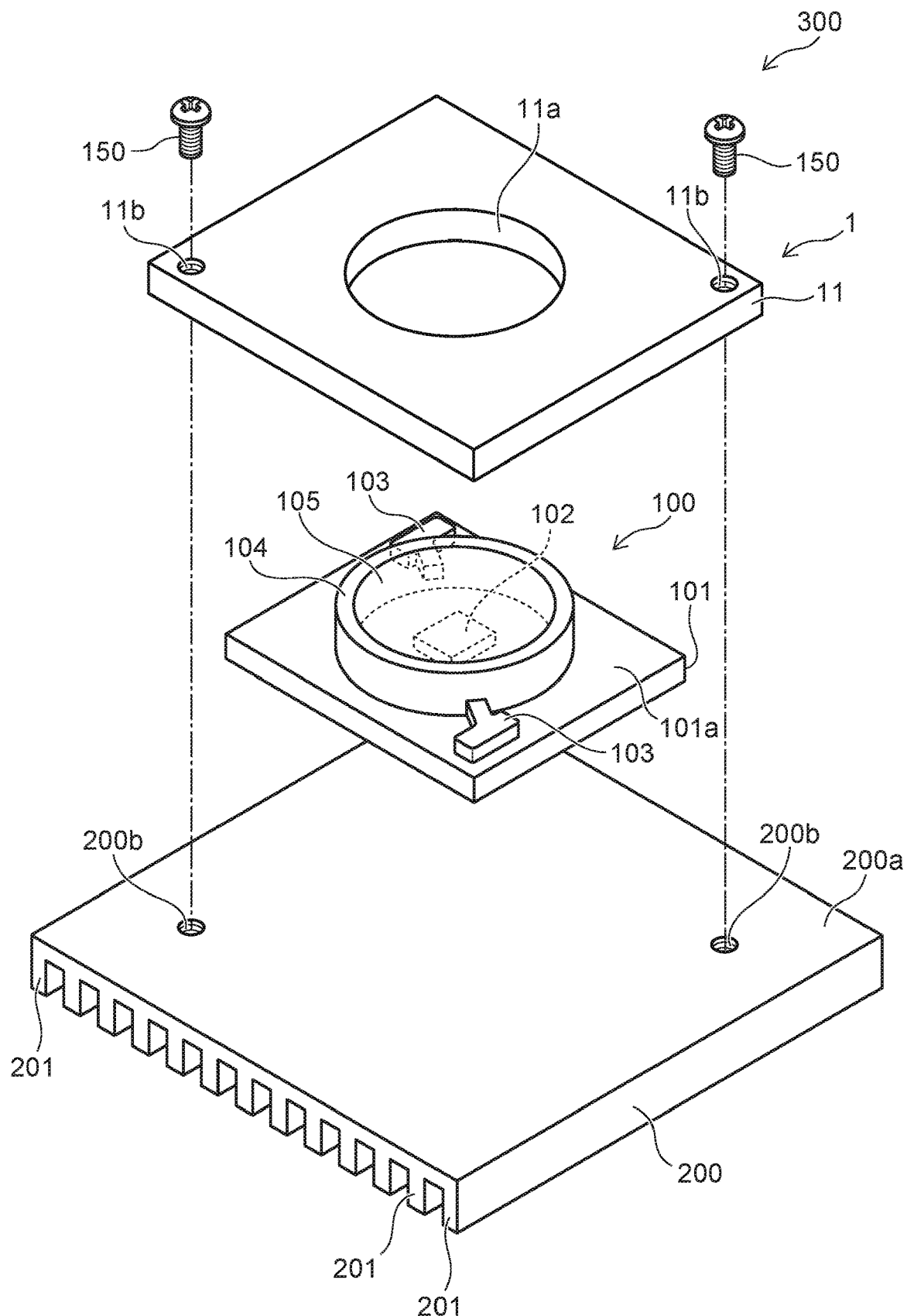
FIG. 1 is an exploded perspective view showing a light source device using a light-emitting device holder according to a first embodiment.

FIG. 1 is an exploded perspective view showing a light source device using a light-emitting device holder according to the present embodiment.

Figure 2A:
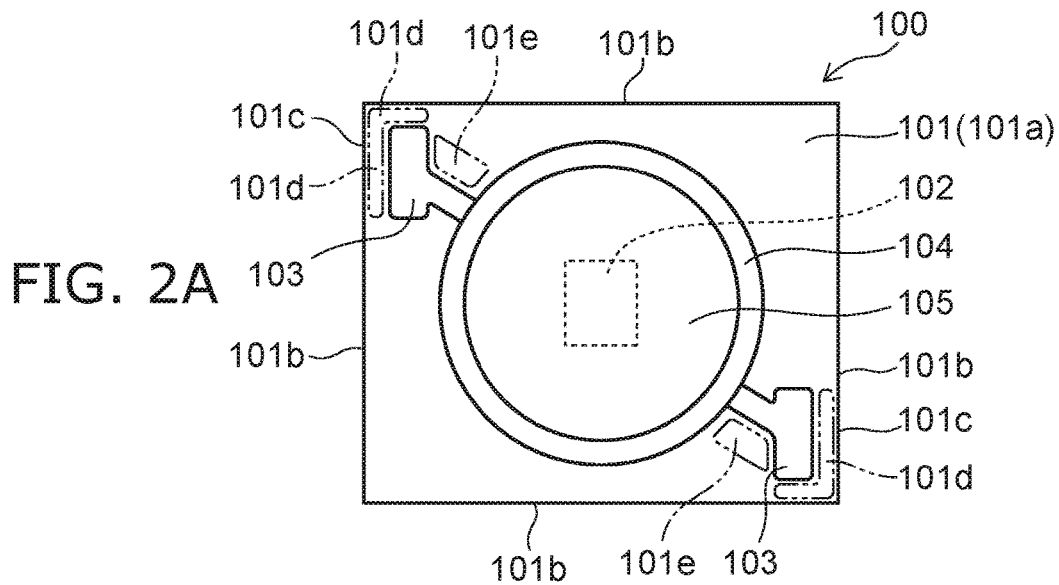
FIG. 2A is a top view showing the light-emitting device to be fixed by the light-emitting device holder according to the first embodiment.

FIG. 2A is a top view showing a light-emitting device to be fixed by the light-emitting device holder according to the present embodiment.

Figure 2B:
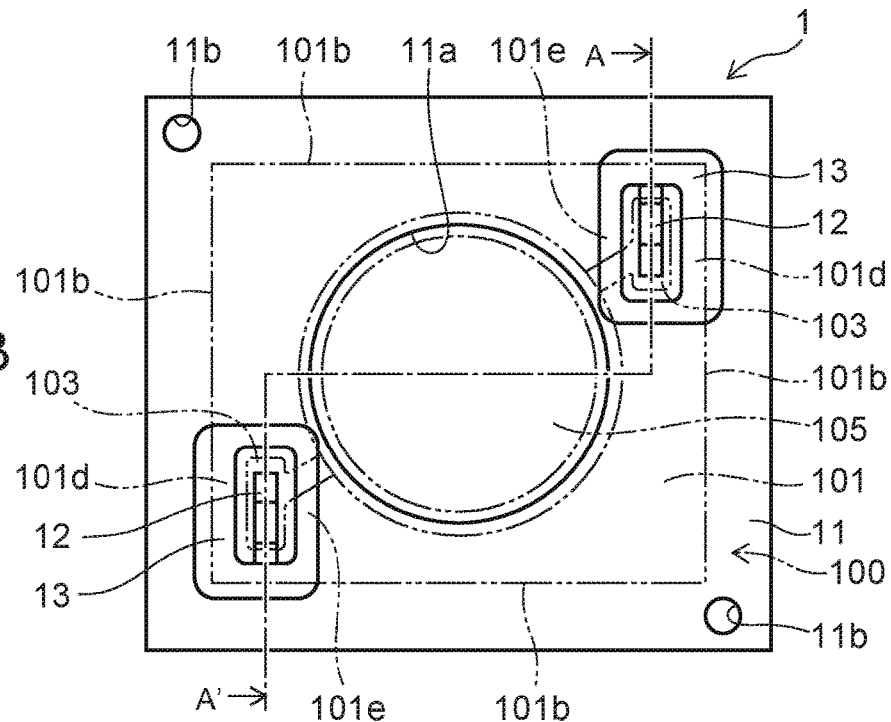
FIG. 2B is a bottom view showing the light-emitting device holder according to the first embodiment.

FIG. 2B is a bottom view showing the light-emitting device holder according to the present embodiment.

Figure 2C:
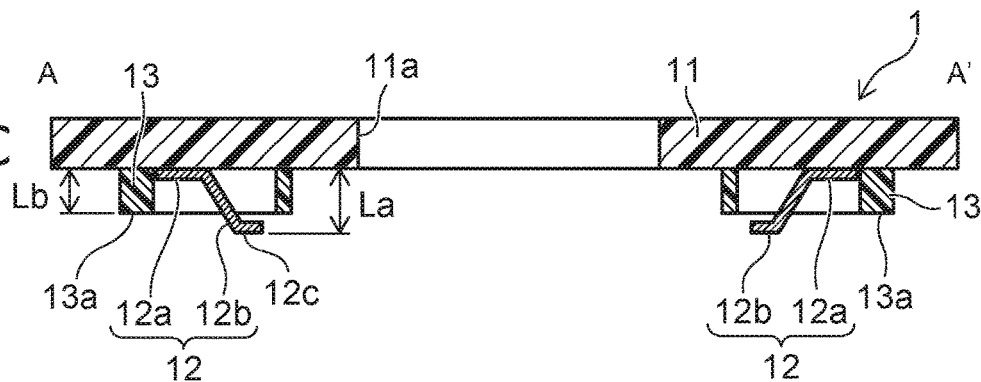
FIG. 2C is a cross-sectional view along line A-A' shown in FIG. 2B.

FIG. 2C is a cross-sectional view along line A-A' shown in FIG. 2B.

In the light source device 300 as shown in FIG. 1, the light-emitting device holder 1 according to the present embodiment fixes the light-emitting device 100 to a heat sink 200 which is one example of a mounting object. The mounting object is not limited to a heat sink and may be, for example, a housing of the light source device 300, etc.

The light-emitting device 100 includes a substrate 101, a light-emitting element 102 mounted to a surface 101a of the substrate 101, and a pair of pads 103 provided on the surface 101a and connected to the light-emitting element 102. The light-emitting element 102 is, for example, an LED and include a p-layer, a light-emitting layer, and an n-layer. The p-layer and the n-layer are connected respectively to the pads 103. For example, the substrate 101 has a rectangular plate shape. The pads 103 are disposed at two of the four corner portions of the substrate 101 at diagonal corners. For example, the pads 103 each have a rectangular configuration and are each drawn out from the light-emitting element 102 by lead portions. Each set of the pad 103 and the wiring portion is formed as one body from an electrically conductive material such as a metal, etc.

As shown in FIG. 1 and FIG. 2A, the light-emitting device 100 further includes a light-reflecting member 104 and a phosphor layer 105. For example, the light-reflecting member 104 is made of a white resin material. The light-reflecting member 104 is disposed on the surface 101a of the substrate 101 to surround the light-emitting element 102 and has, for example, a circular annular shape. The phosphor layer 105 is disposed inward of the light-reflecting member 104 and covers the light-emitting element 102. For example, the phosphor layer 105 contains a phosphor in a main material made of a transparent material, absorbs light emitted from the light-emitting element 102, and emits light having a wavelength different from that of the absorbed light. Thereby, the light-emitting device 100 emits light in which the light emitted by the light-emitting element 102 and the light emitted by the phosphor layer 105 are mixed.

As shown in FIG. 1 and FIG. 2B, the light-emitting device holder 1 includes a holder main body 11, a pair of terminals 12, and a pair of insulating members 13. The holder main body 11 defines an opening at a position corresponding to the light-emitting element 102 after the light-emitting device 100 is fixed to the heat sink 200 serving as the mounting object (hereinbelow, also called the "fixed state"). The pair of terminals 12 are attached to the holder main body 11. The terminals are respectively in contact with the pads 103 in the fixed state, that is, after the light-emitting device 100 is fixed to the heat sink 200. The insulating members 13 are attached to the holder main body 11. In the fixed state, the insulating members 13 are in contact with the surface 101a of the substrate 101 of the light-emitting device 100 in regions 101d, respectively. Each of the regions 101d is positioned between the corresponding one of the pads 103 and a portion 101c of an edge 101b of the substrate 101 that is closest to the corresponding one of the pads 103.

Figure 4:
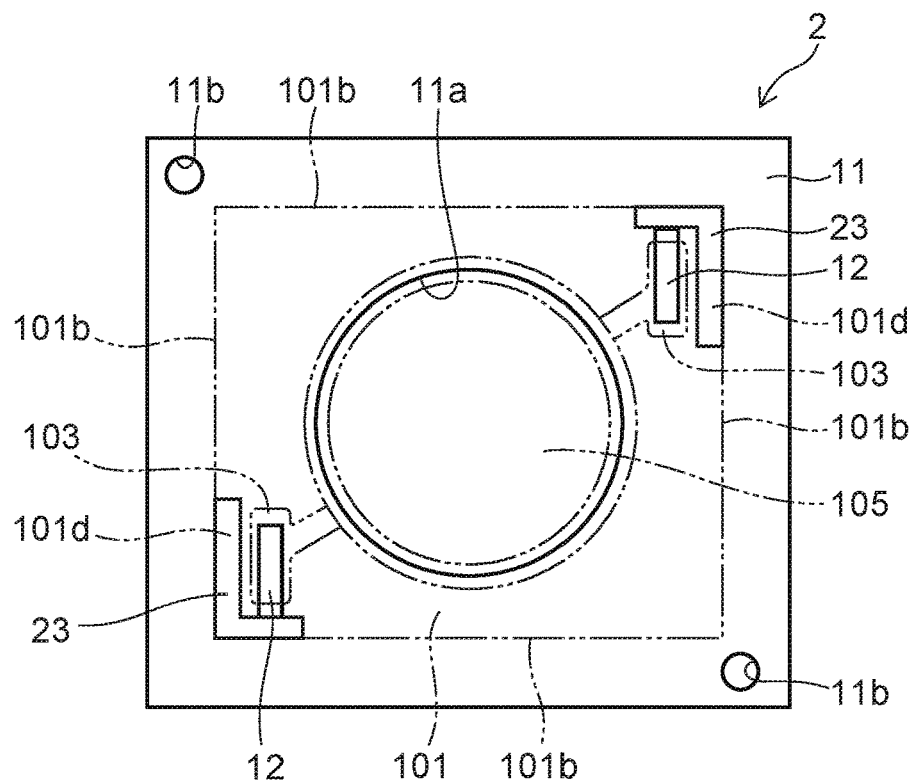
FIG. 4 is a bottom view showing a light-emitting device holder according to a second embodiment.
Figure 5:
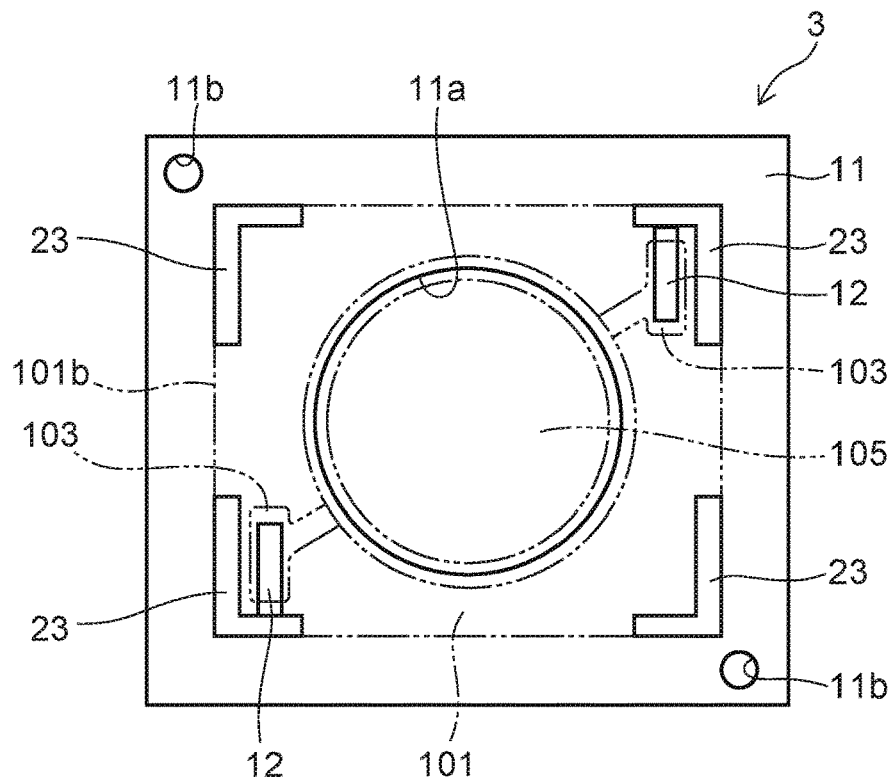
FIG. 5 is a bottom view showing a light-emitting device holder according to a third embodiment.
Figure 6:
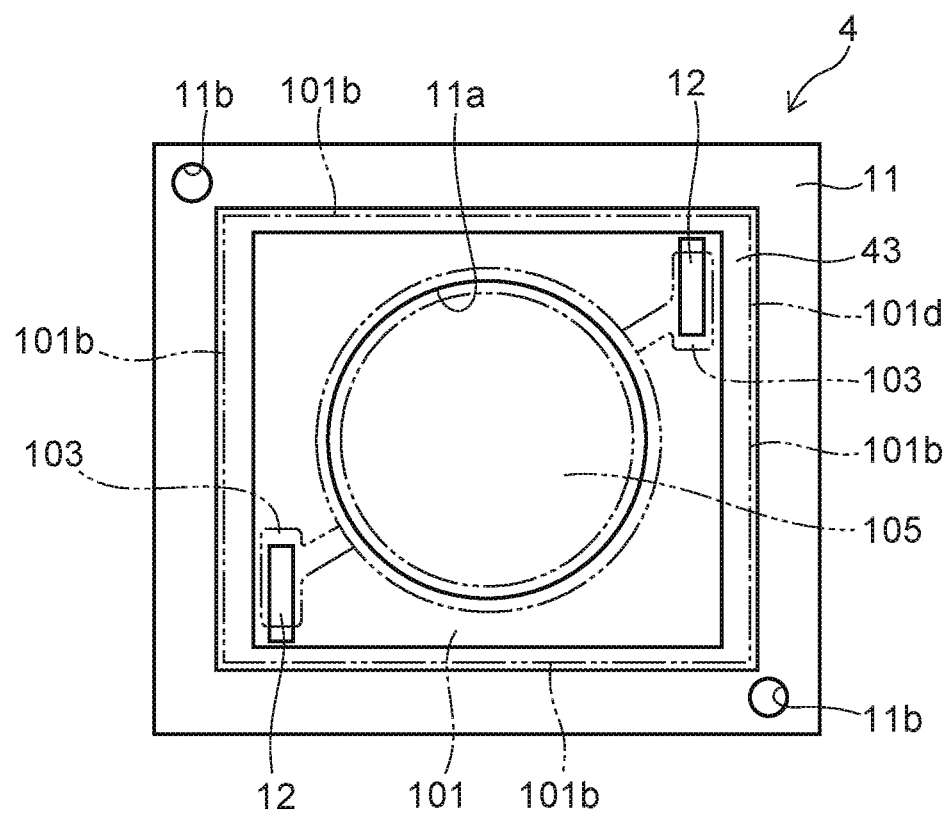
FIG. 6 is a bottom view showing a light-emitting device holder according to a fourth embodiment.

FIG. 2B is a drawing in which the light-emitting device holder 1 is viewed in a plan view from below, i.e., the heat sink 200 side; and the position of the light-emitting device 100 in the fixed state is shown by double dot-dash lines. FIG. 4 to FIG. 6 described below are also illustrated in a similar manner.

The holder main body 11 is made of an insulating material. For example, it is preferable for the holder main body 11 to be white. It is also preferable for the holder main body 11 to be made of a material that is not altered easily by heat, light, etc. It is also preferable for the holder main body 11 to be made of a material that does not easily emit a corrosive gas or a gas that would have an unfavorable effect on the other members due to heat, light, etc. For example, PBT (polybutylene terephthalate), a ceramic, a liquid crystal polymer, etc., are examples of the material included in the holder main body 11.

An opening 11a is formed in the holder main body 11. The opening 11a is positioned at an area facing the light-emitting element 102 when in the fixed state. Through-holes 11b which allow a screw 150 to pass through are formed in the holder main body 11.

The pair of terminals 12 are made of an electrically conductive material having spring property such as, for example, a metal material. The terminals 12 are attached to the holder main body 11 and can be supplied with electrical power from the outside. The pair of terminals 12 are respectively in contact with and connected to the pair of pads 103 when in the fixed state. Thereby, the electrical power is supplied from the outside to the light-emitting element 102 via the terminals 12 of the light-emitting device holder 1.

In this embodiment, two insulating members 13 are provided in the light-emitting device holder 1. The insulating members 13 are attached to the lower surface of the holder main body 11. The insulating members 13 are made of insulating material, such as, for example, an elastic material. More preferably, the insulating members 13 are made of, for example, a white resin material, such as, for example, a silicone resin.

Each of the insulating members 13 has a frame shape that surrounds the corresponding one of the terminals 12 in the plan view in the present embodiment. The insulating members 13 are in contact with the surface 101a of the substrate 101 of the light-emitting device 100 in a region surrounding the corresponding one of the pads 103 after the light-emitting device holder 1 fixes the light-emitting device 100 to the heat sink 200. This region includes the region 101d described above and a region 101e of the surface 101a of the substrate 101 between the pad 103 and the light-emitting element 102. The insulating member 13 may or may not contact the edge 101b of the substrate 101 of the light-emitting device 100. The insulating member 13 may contact the edge 101b of the substrate 101 and protrude from the substrate 101 so as to extend over the edge 101b. It is sufficient for the insulating member 13 to be interposed between the pad 103 and the portion 101c of the edge 101b of the substrate 101 which is closest to the pad 103 and to be in contact with at least the region between the pad 103 and the portion 101c.

As shown in FIG. 2C, when the light-emitting device holder 1 has not been attached to the light-emitting device 100 and the heat sink 200 (hereinbelow, also called the "non-fixed state"), a base portion 12a of the terminal 12 is surrounded by the insulating member 13, but a tip portion 12b of the terminal 12 protrudes from the insulating member 13 to the direction away from the holder main body 11. In other words, as shown in FIG. 2C, a distance La is greater than a distance Lb in the non-fixed state, where the distance La is the distance from the holder main body 11 to a section 12c of the terminal 12 that is farthest from the holder main body 11, and the distance Lb is the distance from the holder main body 11 to the section of the insulating member 13 that is farthest from the holder main body 11, e.g., a lower surface 13a of the insulating member 13. In other words, La>Lb.

As shown in FIG. 1, for example, the heat sink 200 is made of a metal, such as, for example, aluminum and/or copper. An upper surface 200a of the heat sink 200 is flat. A threaded hole 200b where the screw 150 is fastened by screwing is formed in the upper surface 200a. One or more fins 201 may be formed at the lower surface of the heat sink 200.

An operation of the light-emitting device holder 1 according to the present embodiment will now be described.

Figure 3A:
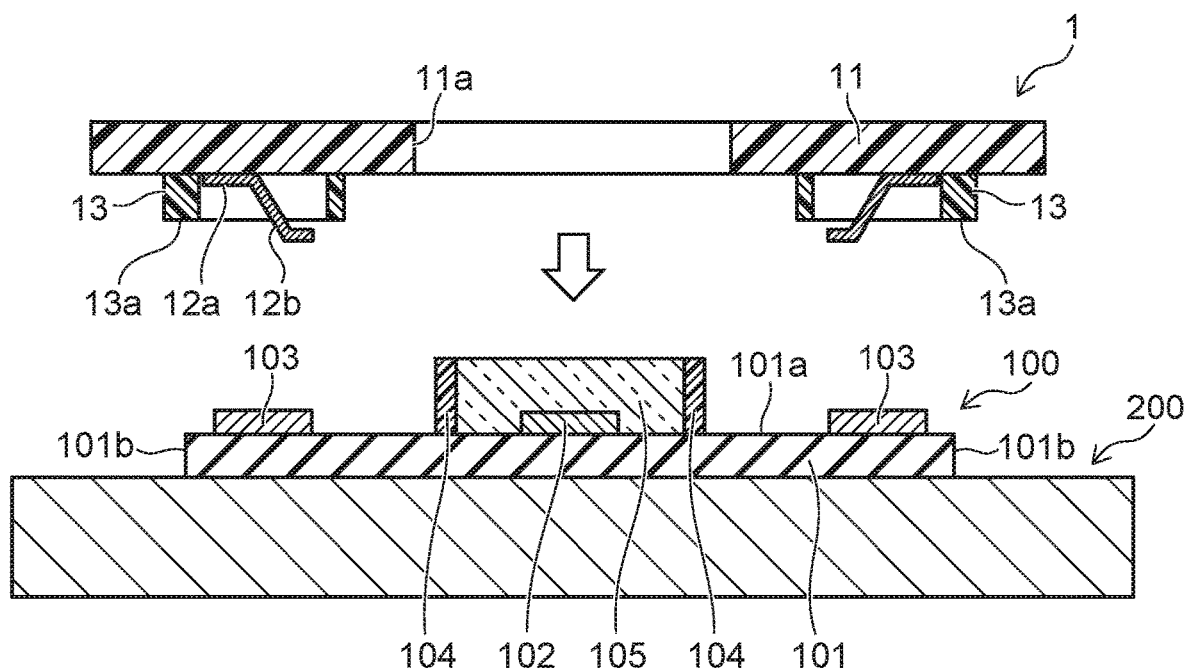
FIG. 3A is a partial cross-sectional view showing a mounting movement of the light-emitting device holder according to the first embodiment, and shows a state in which the light-emitting device has not been fixed to a mounting object by the light-emitting device holder.

FIG. 3A is a partial cross-sectional view showing the mounting movement of the light-emitting device holder according to the present embodiment, and shows the state (i.e., the non-fixed state) in which the light-emitting device holder has not been attached to the light-emitting device and the mounting object.

Figure 3B:
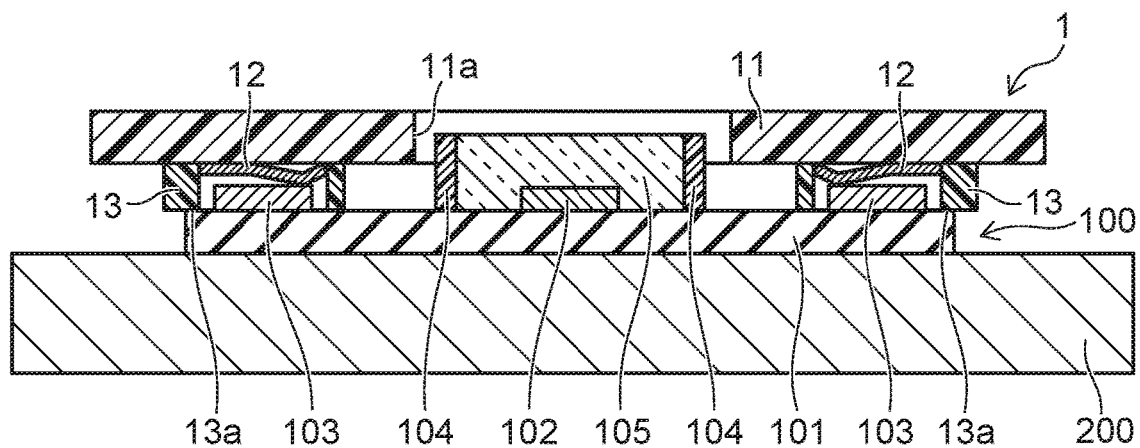
FIG. 3B is a partial cross-sectional view showing a mounting movement of the light-emitting device holder according to the first embodiment, and shows a state in which the light-emitting device is fixed to the mounting object by the light-emitting device holder.

FIG. 3B is a partial cross-sectional view showing the movement of the light-emitting device holder according to the present embodiment, and shows the state (i.e., the fixed state) in which the light-emitting device holder fixes the light-emitting device to the mounting object.

FIG. 3A and FIG. 3B each show a portion of cross section corresponding to the cross section of the light-emitting device holder of FIG. 2C.

As shown in FIG. 3A, the tip portion 12b of the terminal 12 protrudes from the insulating member 13 in the direction away from the holder main body 11 in the non-fixed state, that is, when the light-emitting device holder 1 has not been attached to the light-emitting device 100 and the heat sink 200.

As shown in FIG. 3B, the light-emitting device 100 is disposed between the light-emitting device holder 1 and the heat sink 200. The light-emitting device 100 and the heat sink 200 are fastened by the light-emitting device holder 1 by passing the screws 150 through the through-holes 11b of the holder main body 11 and screwing into the threaded holes 200b of the heat sink 200. Thereby, the light-emitting device holder 1 fixes the light-emitting device 100 to the heat sink 200 (which is the mounting object) with the screws 150. For example, the back surface of the substrate 101 of the light-emitting device 100 contacts the upper surface of the heat sink 200.

At this time, the lower surface 13a of each of the insulating members 13 is in contact with the region of the surface 101a of the substrate 101 of the light-emitting device 100 surrounding the corresponding one of the pads 103. In this embodiment, this region includes the region 101e and the region 101d described above. The insulating members 13 are elastic and therefore deformable; a portion of the insulating members 13 may extend onto the pad 103. The insulating members 13 can be adhered to the substrate 101 even if the surface 101a of the substrate 101 has some degree of unevenness.

At this time, the tip portion 12b of the terminal 12 undergoes elastic deformation because the terminal 12 is in contact with the pad 103 of the light-emitting device 100. Thereby, the entire terminal 12 is surrounded by the insulating member 13, and the tip portion 12b is pressed onto the pad 103 by an elastic force. As a result, the terminal 12 is electrically connected to the pad 103 in a reliable manner.

The insulating member 13 at one side in the light emitting device 100 is in contact with the surface 101a of the substrate 101 in the region 101d between the pad 103 and the region 101c of the edge 101b that is closest to the pad 103.

This can inhibit electric discharge along the surface 101a of the substrate 101 between the pad 103 and the heat sink 200, possibly resulting in improvement of the insulative properties between the pad 103 and the heat sink 200. In other words, this can inhibit the formation of a current path that could pass through the region 101d, and lengthen the electrical creepage distance that reaches the heat sink 200 from the pad 103.

Effects of the present embodiment will now be described.

In the present embodiment, high insulative properties can be realized between the pads 103 and the heat sink 200 by the insulating members 13 of the light-emitting device holder 1 being in contact with the regions 101d of the substrate 101 of the light-emitting device 100. Thus, the present embodiment of the present disclosure can realize a light-emitting device holder and a light-emitting device 300 including such light-emitting device holder in which the insulative properties is improved between the light-emitting device and the mounting object.

Because the insulating member 13 is made of an elastic material, the insulating member 13 can be adhered reliably to the region 101d of the surface 101a of the substrate 101. This can inhibit the formation of a current path that could pass through the region 101d more reliably. High insulative properties and heat resistance can be obtained by forming the insulating member 13 of a silicone resin. Also, using a white insulating member 13 can reduce the effects of the insulating member 13 on the color of the light emitted from the light-emitting device 100.

In the present embodiment, the tip portion 12b of the terminal 12 protrudes from the insulating member 13 in the non-fixed state. Thereby, in the fixed state, the terminal 12 is pressed onto the pad 103 and is connected reliably to the pad 103.

Second Embodiment

A second embodiment will now be described.

FIG. 4 is a bottom view showing a light-emitting device holder according to the present embodiment.

As shown in FIG. 4, the configuration of insulating members of the light-emitting device holder 2 according to the present embodiment is different from that of the light-emitting device holder 1 according to the first embodiment. Each of the insulating members 23 of the present embodiment has an L-shaped configuration when viewed from below as shown in FIG. 4.

The configuration of the light-emitting device 100 is substantially the same as that of the first embodiment. In other words, the substrate 101 of the light-emitting device 100 has a rectangular plate configuration, and the pads 103 are respectively disposed at two corner portions of the substrate 101. At each corner portion where the pads 103 are disposed, the insulating member 23 is in contact with the substrate 101 in the region 101d between the pad 103 and the two edges 101b defining the corner portion.

According to the present embodiment as well, effects similar to those of the first embodiment can be obtained. Otherwise, the configuration, the movement, and the effects of the present embodiment are substantially the same as those of the first embodiment.

Third Embodiment

A third embodiment will now be described.

FIG. 5 is a bottom view showing a light-emitting device holder according to the present embodiment.

As shown in FIG. 5, the light-emitting device holder 3 according to the present embodiment differs from the light-emitting device holder 2 according to the second embodiment in that four insulating members 23 are provided. The four insulating members 23 of the light-emitting device holder 3 respectively be in contact with the four corner portions of the substrate 101 in the fixed state. In other words, in addition to the two corner portions of the substrate 101 where the pads 103 are disposed, the insulating members 23 also be in contact with the two corner portions where the pads 103 are not disposed.

According to the present embodiment, because the four insulating members 23 are respectively in contact with the four corner portions of the substrate 101 of the light-emitting device 100 in the fixed state, wobbling of the light-emitting device 100 is less likely to occur, and the light-emitting device 100 can be fixed reliably to the heat sink 200 serving as the mounting object. Otherwise, the configuration, the movement, and the effects of the present embodiment are similar to those of the first embodiment.

Fourth Embodiment

A fourth embodiment will now be described.

FIG. 6 is a bottom view showing a light-emitting device holder according to the present embodiment.

As shown in FIG. 6, the number and configuration of the insulating members of the light-emitting device holder 4 according to the present embodiment are different from those of the light-emitting device holder 1 according to the first embodiment. One insulating member 43 is provided in the light-emitting device holder 4. The insulating member 43 has a frame shape that substantially entirely surrounds the surface 101*a* of the substrate 101. In the fixed state, the insulating member 43 is in contact with a frame-shaped region along the edge 101*b* of the substrate 101 of the light-emitting device 100. This region includes the region 101*d* described above, i.e., the region between the pad 103 and the portion 101*c* of the edge 101*b* of the substrate 101 that is closest to the pad 103.

According to the present embodiment, in the fixed state, the wobbling of the light-emitting device 100 can be inhibited more reliably by the frame-shaped insulating member 43 being in contact with the region including the edge 101*b* of the substrate 101 of the light-emitting device 100. Otherwise, the configuration, the movement, and the effects of the present embodiment are similar to those of the first embodiment.

A notch may be formed in the insulating member 43 in one or more locations. Thereby, when thermal expansion of the insulating member 43 occurs due to the heat generated at the light-emitting element 102, the notch absorbs the expansion amount. This can inhibit irregular flexing of the insulating member 43.

A presser may be provided separately from the insulating member in the light-emitting device holders according to the present embodiments described above. The presser is selectively provided in a portion of a region of the holder main body 11 other than the region where the insulating member, the opening 11*a*, and the through-hole 11*b* are provided. The height of the presser is set to be slightly lower than the height of the insulating member, i.e., the distance Lb shown in FIG. 2C. Thereby, the substrate 101 is in contact with the presser when the light-emitting device holder is pressed onto the substrate 101 of the light-emitting device 100 and the insulating member is mashed somewhat. As a result, the wobbling of the light-emitting device 100 in the fixed state can be inhibited more reliably.

Although examples according to the embodiments described above employ a heat sink as a mounting object to which the light-emitting device 100 is fixed, this is not limited thereto. Although examples according to the embodiments described above employ a heat sink as a mounting object with which the light-emitting device 100 contacts, this is not limited thereto. Any member may be interposed between the light-emitting device 100 and the mounting object. For example, a thermally conductive sheet, a thermally conductive paste, etc., may be interposed between the heat sink 200 and the back surface of the substrate 101 of the light-emitting device 100 to improve the hermeticity or reduce the thermal resistance.

For example, the invention can be utilized in a lighting device, a light source of a display device, etc.

What is claimed is:

1. A light-emitting device holder configured to fix a light-emitting device to a mounting object, the light-emitting device including a substrate having a rectangular plate shape, a light-emitting element mounted to a surface of the substrate, and a pad provided on the surface of the substrate at a corner portion of the substrate and connected to the light-emitting element, the light-emitting device holder comprising:
   a holder main body defining an opening at a position corresponding to the light-emitting element in a fixed state after the light-emitting device is fixed to the mounting object by the light-emitting device holder;
   a terminal attached to the holder main body, the terminal being configured to be in contact with the pad in the fixed state; and
   an insulating member attached to the holder main body, the insulating member being configured to be in contact with at least a region of the surface of the substrate between the pad and two edges defining the corner portion of the substrate that is closest to the pad in the fixed state.

2. The light-emitting device holder according to claim 1, wherein the insulating member is made of an elastic material.

3. The light-emitting device holder according to claim 1, further comprising
   an additional insulating member attached to the holder main body on an opposite side of the insulating member with respect to the opening in a plan view, the additional insulating member being configured to be in contact with at least a region of the surface of the substrate between an additional pad of the light-emitting device and a portion of an edge of the substrate that is closest to the additional pad in the fixed state, and
   an additional terminal attached to the holder main body, the additional terminal being configured to be in contact with the additional pad in the fixed state.

4. The light-emitting device holder according to claim 1, wherein the insulating member is further configured to be in contact with a region of the surface of the substrate between the pad and the light-emitting element.

5. The light-emitting device holder according to claim 1, wherein the insulating member is further configured to be in contact with a region of the surface of the substrate at a corner portion of the substrate where the pad is not disposed.

6. The light-emitting device holder according to claim 1, wherein the insulating member is configured to be in contact with a frame-shaped region of the surface of the substrate along the edge of the substrate.

7. The light-emitting device holder according to claim 1, wherein
   the terminal is elastic, and
   in a non-fixed state when the light-emitting device holder has not been attached to the light-emitting device and the mounting object, a distance from the holder main body to a section of the terminal that is farthest to the holder main body is greater than a distance from the holder main body to a section of the insulating member that is farthest to the holder main body.

8. The light emitting device holder according to claim 1, wherein
   the insulating member has a frame-shape surrounding the terminal in the plan view.

9. The light emitting device holder according to claim 1, wherein
   the insulating member has an L-shape in the plan view.

10. The light emitting device holder according to claim 3, wherein
    the insulating member has a frame-shape surrounding the terminal in the plan view, and
    the additional insulating member has a frame-shape surrounding the additional terminal in the plan view.

11. The light-emitting device holder according to claim 3, wherein
    each of the insulating member and the additional insulating member has an L-shape in the plan view.

12. A light-emitting device holder configured to fix a light-emitting device to a mounting object, the light-emitting device including a substrate, a light-emitting element mounted to a surface of the substrate, and a pad provided on the surface of the substrate and connected to the light-emitting element, the light-emitting device holder comprising:
- a holder main body defining an opening at a position corresponding to the light-emitting element in a fixed state after the light-emitting device is fixed to the mounting object by the light-emitting device holder;
- a terminal attached to the holder main body, the terminal being configured to be in contact with the pad in the fixed state;
- an insulating member attached to the holder main body, the insulating member being configured to be in contact with at least a region of the surface of the substrate between the pad and a portion of an edge of the substrate that is closest to the pad in the fixed state;
- an additional insulating member attached to the holder main body on an opposite side of the insulating member with respect to the opening in a plan view, the additional insulating member being configured to be in contact with at least a region of the surface of the substrate between an additional pad of the light-emitting device and a portion of an edge of the substrate that is closest to the additional pad in the fixed state; and
- an additional terminal attached to the holder main body, the additional terminal being configured to be in contact with the additional pad in the fixed state, wherein the substrate has a rectangular plate shape, the pad and the additional pad are respectively disposed at diagonally arranged corner portions of the substrate, the insulating member is configured to be in contact with the region of the surface of the substrate between the pad and two edges defining a corresponding one of the corner portions, and the additional insulating member is configured to be in contact with the region of the surface of the substrate between the additional pad and two edges defining a corresponding one of the corner portions.

13. A light-emitting device holder configured to fix a light-emitting device to a mounting object, the light-emitting device including a substrate, a light-emitting element mounted to a surface of the substrate, and a pad provided on the surface of the substrate and connected to the light-emitting element, the light-emitting device holder comprising:
- a holder main body defining an opening at a position corresponding to the light-emitting element in a fixed state after the light-emitting device is fixed to the mounting object by the light-emitting device holder;
- a terminal attached to the holder main body, the terminal being configured to be in contact with the pad in the fixed state; and
- an insulating member attached to the holder main body, the insulating member being configured to be in contact with at least a region of the surface of the substrate between the pad and a portion of an edge of the substrate that is closest to the pad in the fixed state, wherein the substrate has a rectangular plate shape, and the insulating member is configured to be in contact with all four corner portions of the surface of the substrate.

* * * * *